(12) United States Patent
Brenner et al.

(10) Patent No.: US 12,438,107 B2
(45) Date of Patent: Oct. 7, 2025

(54) HIGH FREQUENCY DEVICES INCLUDING ATTENUATING DIELECTRIC MATERIALS

(71) Applicant: Infineon Technologies AG, Neubiberg (DE)

(72) Inventors: Pietro Brenner, Ebersberg (DE); Walter Hartner, Bad Abbach-Peissing (DE); Julian Winfried Kaiser, Munich (DE); Saqib Kaleem, Munich (DE)

(73) Assignee: Infineon Technologies AG, Neubiberg (DE)

( * ) Notice: Subject to any disclaimer, the term of this patent is extended or adjusted under 35 U.S.C. 154(b) by 720 days.

(21) Appl. No.: 17/454,120

(22) Filed: Nov. 9, 2021

(65) Prior Publication Data
US 2022/0189892 A1    Jun. 16, 2022

(30) Foreign Application Priority Data
Dec. 16, 2020   (DE) .......................... 102020133756.6

(51) Int. Cl.
*H01L 23/66* (2006.01)
*H01L 23/31* (2006.01)
*H01L 23/552* (2006.01)
*H01L 25/065* (2023.01)
*H01Q 1/52* (2006.01)
(Continued)

(52) U.S. Cl.
CPC .......... *H01L 23/66* (2013.01); *H01L 23/3114* (2013.01); *H01L 23/552* (2013.01); *H01L 25/0657* (2013.01); *H01L 2223/6677* (2013.01); *H01L 2223/6688* (2013.01);
(Continued)

(58) Field of Classification Search
CPC . H01L 23/3185; H01L 23/3157; H01L 21/56; H01L 21/563; H01L 23/5389; H01L 25/0657; H01L 25/0652; H01L 25/043; H01L 25/071; H01L 25/074; H01L 25/0756; H01L 25/112; H01L 25/117; H01L 2224/08145; H01L 27/0688; H01L 23/66; H01L 23/552–556; H01L 2223/66; H01L 2223/6677; H01L 2223/6688; H01L 2223/6694; H01L 2924/3025; H01Q 1/52; H01Q 1/526; H01Q 1/525; H10K 50/854; H10K 50/84; H10K 30/88; H10F 77/50
See application file for complete search history.

(56) References Cited

U.S. PATENT DOCUMENTS

2007/0166520 A1    7/2007 Leib et al.
2014/0110840 A1*   4/2014 Wojnowski .............. H01Q 9/16
                                                     257/738
(Continued)

FOREIGN PATENT DOCUMENTS

JP     2007-5477 A    1/2007
JP    2019-21757 A    2/2019
(Continued)

*Primary Examiner* — Wael M Fahmy
*Assistant Examiner* — Quinton A Brasfield
(74) *Attorney, Agent, or Firm* — Harrity & Harrity, LLP

(57) ABSTRACT

A device includes a high frequency chip and a dielectric material arranged between a first area radiating an electromagnetic interference signal in a first frequency range between 1 GHz and 1 THz and a second area receiving the electromagnetic interference signal. An attenuation of the dielectric material is more than 5 dB/cm at least in a subrange of the first frequency range.

27 Claims, 8 Drawing Sheets

(51) Int. Cl.
*H10F 77/50* (2025.01)
*H10K 30/88* (2023.01)

(52) U.S. Cl.
CPC .............. *H01Q 1/52* (2013.01); *H01Q 1/525* (2013.01); *H10F 77/50* (2025.01); *H10K 30/88* (2023.02)

(56) References Cited

U.S. PATENT DOCUMENTS

| | | | | |
|---|---|---|---|---|
| 2014/0231973 | A1* | 8/2014 | Huang | ................... H01L 23/295 257/659 |
| 2016/0211189 | A1* | 7/2016 | Niessner | ................ H01L 21/563 |
| 2020/0105689 | A1* | 4/2020 | Hwang | ............. H01L 23/49534 |
| 2020/0168518 | A1* | 5/2020 | Lee | ..................... H01L 21/6835 |
| 2020/0211978 | A1* | 7/2020 | Pei | ......................... H01L 21/565 |

FOREIGN PATENT DOCUMENTS

| WO | 2016/053391 A1 | 4/2016 |
|---|---|---|
| WO | 2019/089769 A1 | 5/2019 |

\* cited by examiner

HIGH FREQUENCY DEVICES INCLUDING ATTENUATING DIELECTRIC MATERIALS

CROSS REFERENCE TO RELATED APPLICATION

This application claims priority to German Patent Application No. 102020133756.6, filed on Dec. 16, 2020, the contents of which are incorporated by reference herein in their entirety.

TECHNICAL FIELD

The present disclosure relates to high frequency devices including attenuating dielectric materials. In addition, the present disclosure relates to methods for manufacturing such devices.

BACKGROUND

In high frequency applications electrical interconnects may have the tendency to radiate more and more due to an increasing electrical length. With increasing operational frequencies, conducting areas, planes or interconnects of a high frequency application may radiate into adjacent dielectrics or into air. Such undesirable radiation may, for example, result in an increasing crosstalk between different circuit areas of the application.

SUMMARY

An aspect of the present disclosure relates to a device. The device comprises a high frequency chip and a dielectric material arranged between a first area radiating an electromagnetic interference signal in a first frequency range between 1 GHz and 1 THz and a second area receiving the electromagnetic interference signal. An attenuation of the dielectric material is more than 5 dB/cm at least in a subrange of the first frequency range.

An aspect of the present disclosure relates to a device. The device comprises a high frequency chip and an encapsulation material, wherein the high frequency chip is at least partly encapsulated in the encapsulation material. The encapsulation material is arranged between a first area radiating an electromagnetic interference signal in a first frequency range between 1 GHz and 1 THz and a second area receiving the electromagnetic interference signal. An attenuation of the encapsulation material is more than 5 dB/cm at least in a subrange of the first frequency range.

An aspect of the present disclosure relates to a device. The device comprises a high frequency chip and an encapsulation material, wherein the high frequency chip is at least partly encapsulated in the encapsulation material. The encapsulation material is arranged between a first area radiating an electromagnetic interference signal in a first frequency range between 1 GHz and 1 THz and a second area receiving the electromagnetic interference signal. A surface roughness of a peripheral surface of the encapsulation material provides an attenuation of the electromagnetic interference signal between the first and second area of more than 5 dB/cm.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims. Some technics and apparatuses described herein may enable a reduction in electromagnetic interferences and crosstalk between circuit areas of high frequency devices and thus increase a performance and reliability of the high frequency devices.

Figure 1:
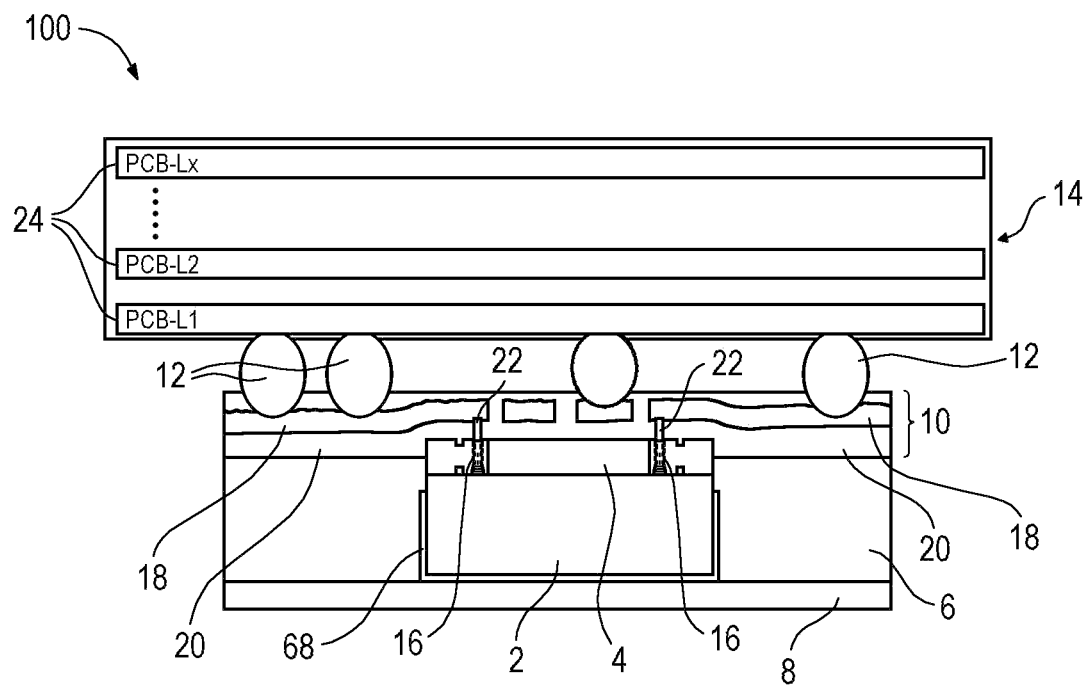
FIG. 1 schematically illustrates a cross-sectional side view of a device, in accordance with the disclosure.

The device 100 of FIG. 1 may include a semiconductor chip 2 (which may also be referred to as a semiconductor die) having a BEOL (Back End Of Line) stack 4. The semiconductor chip 2 may be at least partly encapsulated (or embedded) in an encapsulation material 6. A bottom surface and/or side surfaces of the semiconductor chip 2 may optionally be covered by a material layer 8. In some implementations, a protective layer 8 may be arranged over the bottom surface of the semiconductor chip 2. One or more electrical redistribution layers 10 may be arranged over the top surface of the semiconductor chip 2 and the top surface of the encapsulation material 6. One or more external connection elements 12 may provide a mechanical and electrical connection between the device 100 and a printed circuit board 14. The device 100 may include the printed circuit board 14 or not.

In some implementations, the semiconductor chip 2 (or electronic circuits of the semiconductor chip 2) may operate in a frequency range of higher than about 1 GHz. In some implementations, the semiconductor chip 2 (or electronic circuits of the semiconductor chip 2) may operate in a frequency range of higher than about 10 GHz. The semiconductor chip 2 may thus also be referred to as radio frequency chip or high frequency chip or microwave frequency chip. In some implementations, the semiconductor chip 2 may operate in a high frequency range or microwave frequency range, which may range from about 1 GHz to about 1 THz, more particular from about 10 GHz to about 300 GHz. Microwave circuits may include, for example, microwave transmitters, microwave receivers, microwave transceivers, microwave sensors, microwave detectors, etc. Devices in accordance with the disclosure may be used for radar applications in which the frequency of the high frequency signals may be modulated. Accordingly, the semiconductor chip 2 may particularly correspond to a radar chip.

Radar microwave devices may be used, for example, in automotive, industrial, military and/or defense applications for range and speed measuring systems. By way of example, automatic vehicle cruise control systems or vehicle anti-collision systems may operate in the microwave frequency range, for example in the 24 GHz, 76 GHz, or 79 GHz frequency bands. In particular, the use of such systems may provide constant and efficient driving of a vehicle. An efficient driving style may, for example, reduce fuel consumption and thus enable energy savings. In addition, abrasion of vehicle tires, brake discs and brake pads may be reduced, thereby reducing fine dust pollution. Improved radar systems, as specified in this description, may thus at least indirectly contribute to green technology solutions, e.g., climate-friendly solutions providing a reduced mitigation of energy use.

The semiconductor chip 2 may include one or more electrical contacts 16 that may be arranged on a main surface of the semiconductor chip 2. For example, an electrical contact 16 may be formed by a bond pad which may be made of aluminum and/or copper. The BEOL metal stack 4 of semiconductor chip 2 may provide an electrical coupling between the electrical contacts 16 and one or more electronic circuits (not illustrated) integrated in semiconductor chip 2. This allows electrical signals to be transmitted from the semiconductor chip 2 to the electrical contacts 16 and/or vice versa. The electronic circuits of the semiconductor chip 2 may thus be electrically accessible via the electrical contacts 16 and the BEOL stack 4. The BEOL stack 4 may have been formed in a Back End Of Line (BEOL) process. The BEOL stack 4 may include metal layers and dielectric layers similar to the electrical redistribution layer 10 which will be described later on. When measured in a vertical direction, a thickness of a dielectric layer of the BEOL stack 4 may be in a range from about 10 nanometers to about 5 micrometers, or from about 10 nanometers to about 1 micrometer, or from about 10 nanometers to about 100 nanometers. A dielectric layer of the BEOL stack 4 may have a dielectric constant $\varepsilon_r$ in a range from about 2 to about 5.

The semiconductor chip 2 may be at least partly embedded in the encapsulation material 6. In the implementations of FIG. 1, the encapsulation material 6 may cover one or more side surfaces of the semiconductor chip 2. In further implementations, the encapsulation material 6 may also cover the upper and/or lower main surface of the semiconductor chip 2. In the implementation of FIG. 1, the lower main surface of the semiconductor chip 2 may be uncovered by the encapsulation material 6. Rather, the lower main surface of the encapsulation material 6 and the lower main surface of the semiconductor chip 2 may be substantially arranged in a common plane and may be covered by the protective layer 8. The encapsulation material 6 may form a housing (package) of the semiconductor chip 2 such that the device 100 may also be referred to as a semiconductor package. The encapsulation material 4 may include at least one of the following materials: epoxy, filled epoxy, glass fiber filled epoxy, imide, thermoplast, thermoset polymer, polymer blend. In some implementations, the encapsulation material 6 may be formed from a mold compound. The material layer 68 covering the backside and/or the side surfaces of the semiconductor chip 2 may be a metal cage for shielding in one implementation or a dielectric spacer in another implementation. The protective layer 8 arranged over the backside of the semiconductor chip 2 may be made of at least one of a mold compound or a BSP (Back Side Protection) foil.

The electrical redistribution layer 10 may have one or more electrically conductive structures 18 in the form of metal layers (or metal tracks), which may run substantially parallel to the main surfaces of the semiconductor chip 2 and the encapsulation material 6. The metal layers 18 may, for example, be made of copper or a copper alloy. One or more dielectric layers 20 may be arranged between the metal layers 18 to electrically isolate the metal layers 18 from each other. For example, the dielectric layers 20 may be made of at least one of an oxide or a nitride. Furthermore, metal layers 18 arranged on different vertical levels may be electrically connected to each other by one or more via connections 22.

The electrical redistribution layer 10 may at least partly extend over the upper main surface of the encapsulation material 6. Accordingly, at least one of the external connection elements 12 may be arranged lateral of the semiconductor chip 2. In such case, the device 100 may be referred to as a fan-out device or a fan-out package. In the implementation of FIG. 1, the device 100 may correspond to a wafer level package, which may be manufactured by an eWLB (embedded Wafer Level Ball Grid Array) process.

The device 100 may be mounted on the printed circuit board 14 using the external connection elements 12. Electronic structures of the semiconductor chip 2 may be electrically accessible from outside of the semiconductor package via the external connection elements 12. For example, the external connection elements 12 may include at least one of a solder ball or a solder pillar. The printed circuit board 14 may include multiple layers 24 stacked over each other. In some implementations, the layers 24 may be made of a dielectric material. For example, the layers 24 may include or may be made of at least one of a high frequency laminate material, a prepreg material (preimpregnated fiber), or an FR4 material. When measured in the vertical direction, a thickness of a PCB layer 24 may be in a range from about 20 micrometers to about 200 micrometers, or in a range from about 80 micrometers to about 200 micrometers, or in a range from about 160 micrometers to about 200 micrometers. A dielectric layer 24 may have a dielectric constant $\varepsilon_r$ in a range from about 3 to about 7. In some implementations, the printed circuit board 14 may include electrically conductive structures arranged on the bottom surface and/or on the top surface (not illustrated) as well as electrically conductive structures arranged inside of the printed circuit board 14 (not illustrated).

Figure 2:
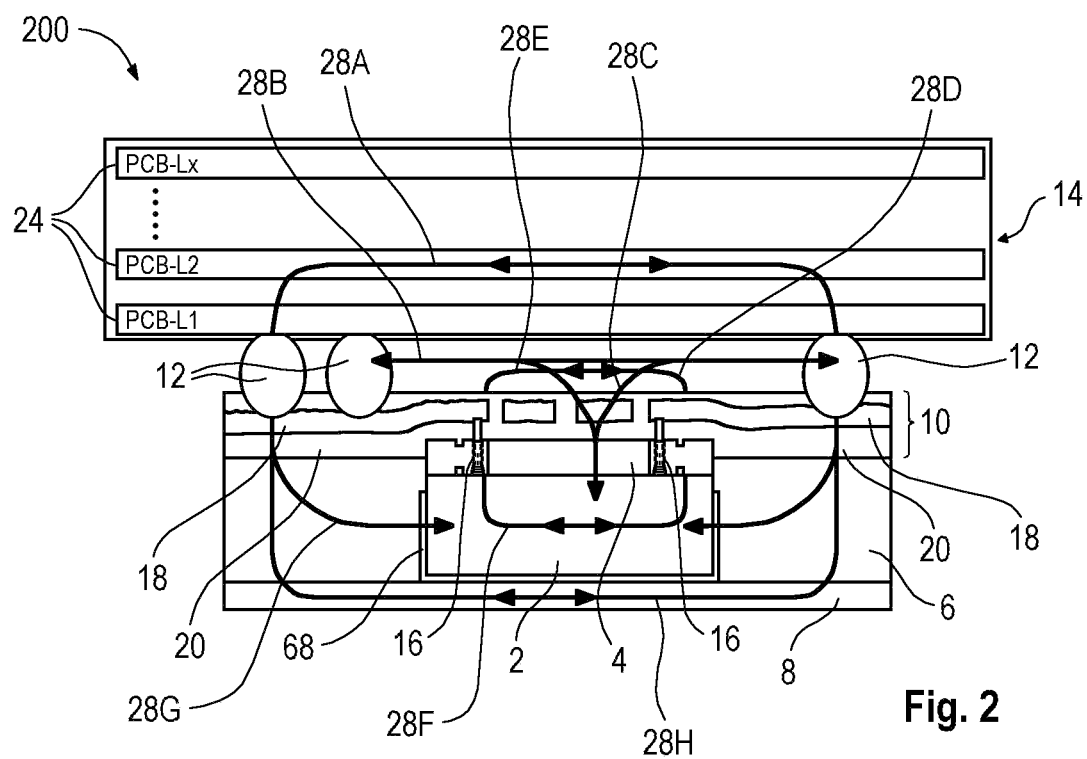
FIG. 2 schematically illustrates a cross-sectional side view of a device and electromagnetic interferences that may occur in the device, in accordance with the disclosure.

The device 200 of FIG. 2 may include some or all of the features of the device 100 of FIG. 1. FIG. 2 schematically illustrates electromagnetic interferences that may occur during an operation of the device 200. In some implementations, at mmWave or microwave frequency applications (such as, for example, automotive radar, mobile communication, consumer and military radar applications) electrical interconnects of the device 200 may have the tendency to radiate more and more due to their increasing electrical length. Accordingly, with increasing operational frequencies, conducting areas, planes or interconnects may radiate into adjacent dielectrics or may radiate into the air. Such radiation may occur in arbitrary directions, wherein a magnitude of the radiation may increase with increasing operation frequencies.

The undesired radiation or leakage may result in an increased crosstalk and electromagnetic interference (EMI) between circuits areas, which may be at DC (Direct Current) and low/mid frequencies well isolated to each other. Here, some signal or power-ground (PG) routing in one circuit area may act as a signal transmitter (or aggressor) and some other routing in another circuit area may behave like a signal receiver (or victim). At high frequencies, dielectric layers of the device 200 may behave like dielectric waveguides which may redirect parasitic electromagnetic interference signals between two areas of the device 200 where these signals may interfere with and disturb other electromagnetic signals.

In general, a first area of the device 200 may radiate one or more electromagnetic interference signals, and a second area of the device 200 may receive the electromagnetic interference signals. In some implementations, the electromagnetic interference signals particularly may be in a frequency range between about 1 GHz and about 1 THz. In some implementations, the electromagnetic interference signals particularly may be in a frequency range between about 10 GHz and about 300 GHz. In this regard, FIG. 2 qualitatively illustrates possible electromagnetic interferences (or crosstalk) 28A to 28G that may occur between two areas of the device 200. The paths of the electromagnetic interferences 28A to 28G occurring between respective areas of the device 200 are qualitatively indicated by arrows. Further interference paths may be possible, but not all of such possible interference paths are illustrated for the sake of simplicity. Additional interference paths may, for example, extend between the PCB layers, for example between layers PCB-L1 and PCB-L2. In general, each of a first area and a second area may include at least one of: an electric signal routing path, a power or ground supply distribution path, a section of an integrated circuit, an electrical interconnection element, an antenna.

Figure 3:
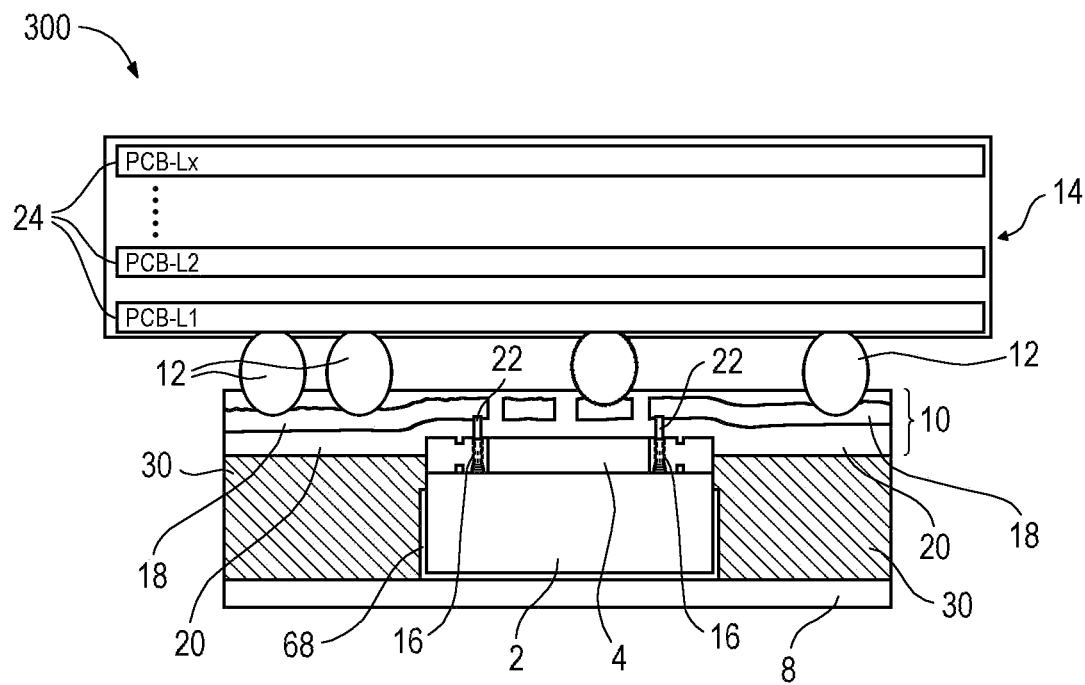
FIG. 3 schematically illustrates a cross-sectional side view of a device, in accordance with the disclosure.

The device 300 of FIG. 3 may include some or all of the features of the devices 100 and 200 of FIGS. 1 and 2. In some implementations, the device 300 of FIG. 3 may include a dielectric material 30 which may be arranged between a first area radiating an electromagnetic interference signal in a frequency range between about 1 GHz and about 1 THz, or between about 10 GHz and about 300 GHz and a second area receiving the electromagnetic interference signal. Comparing FIGS. 1 and 3, the dielectric material 30 of FIG. 3 may at least partly replace the encapsulation material 6 of FIG. 1. In the implementation of FIG. 3, the dielectric material 30 may be arranged in the fan-out area of the device 300. The dielectric material 30 of FIG. 3 may, for example, be arranged in electromagnetic interference paths 28G and 28H, as shown in FIG. 2. By incorporating the dielectric material 30 in one or more of occurring electromagnetic interference paths, electromagnetic interference signals or crosstalk between two areas of the device 300 may be attenuated and reduced. The device 300 of FIG. 3 may therefore provide an improved performance and reliability.

In some implementations, an attenuation of the dielectric material 30 may be more than 5 dB/cm in an arbitrary subrange of the frequency range between about 1 GHz and about 1 THz (or between about 10 GHz and about 300 GHz). In some implementations, an attenuation of the dielectric material 30 may be more than 5 dB/cm over the entire frequency range. That is, when an electromagnetic interference signal passes through 1 cm of the dielectric material 30, an attenuation or loss of the interference signal may correspond to a value of 5 dB. In some implementations, the dielectric material 30 may have an attenuation greater than an attenuation of the other materials included in the device 300. In order to attenuate the electromagnetic interference signal, the dielectric material 30 may be configured to provide at least one of scattering or absorbing the electromagnetic interference signal. It is to be noted that throughout this description, the terms "attenuation", "transmission attenuation", "transmission attenuation factor", "loss", "transmission loss", "transmission loss factor" may be interchangeably used.

Figure 17:
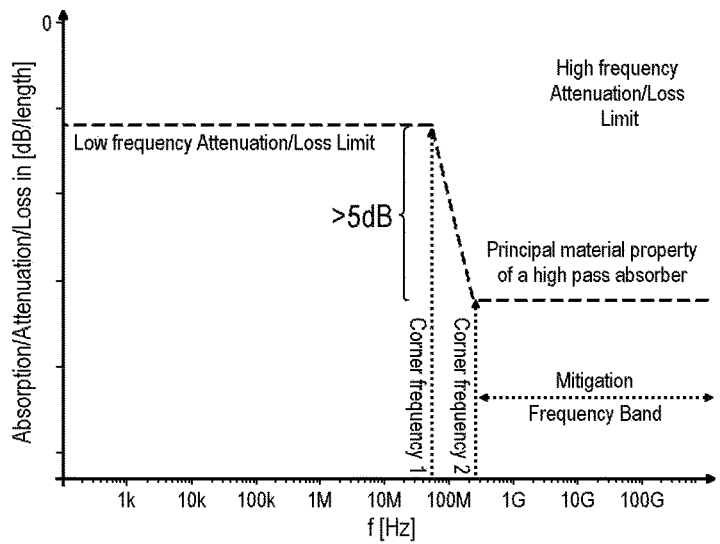
FIG. 17 illustrates a frequency dependency of an attenuation of a dielectric material which may be included in a device, in accordance with the disclosure.

In some implementations, the dielectric material 30 may be configured as a high pass absorber. A frequency dependency of an attenuation of such a dielectric material is exemplarily illustrated in FIG. 17. Here, the attenuation of the dielectric material 30 (in dB/length) is plotted against the frequency of the interference signal (in Hz). The dielectric material 30 may have an attenuation of more than 5 dB/cm in a mitigation frequency band in a high frequency range. In some implementations, the dielectric material 30 may have in a low frequency range an attenuation of at least 5 dB/cm less than in the mitigation frequency band. In some implementations, an attenuation of the dielectric material 30 may be smaller than 0.5 dB/cm for frequencies lower than 1 GHz.

Figure 18:
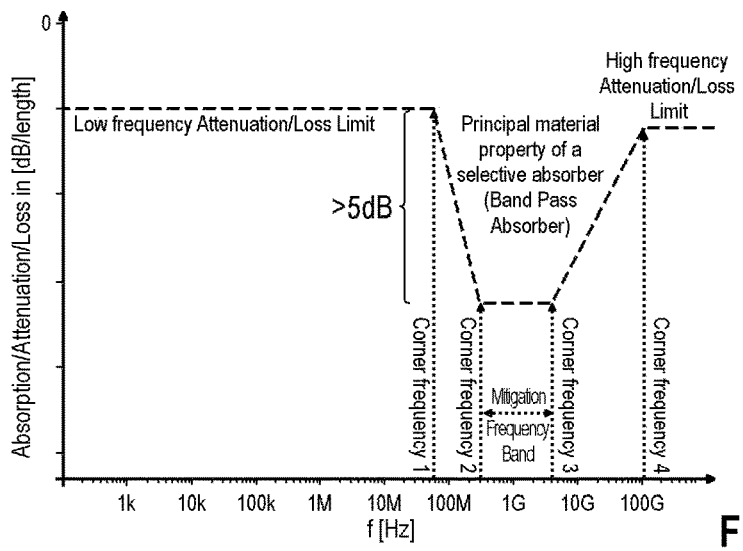
FIG. 18 illustrates a frequency dependency of an attenuation of a dielectric material which may be included in a device, in accordance with the disclosure.

In some implementations, the dielectric material 30 may be configured as a selective absorber or band pass absorber. A frequency dependency of an attenuation of such a dielectric material is exemplarily illustrated in FIG. 18. The dielectric material 30 may have an attenuation of more than 5 dB/cm in a mitigation frequency band. In some implementations, the dielectric material 30 may have in a low frequency range an attenuation of at least 5 dB/cm less than in the mitigation frequency band. In some implementations, an attenuation of the dielectric material may be smaller than 0.5 dB/cm for frequencies lower than 1 GHz. In some implementations, the dielectric material 30 may have in a high frequency range an attenuation of at least 5 dB/cm less than in the mitigation frequency band.

The dielectric material 30 used in the device 300 and all further devices in accordance with the disclosure may include one or more materials configured to provide the described attenuation properties of the dielectric material 30. Example dielectric materials 30 are specified elsewhere herein and below.

In some implementations, the dielectric material 30 may include at least one of carbon nanotubes or porous carbon. In some implementations, the dielectric material 30 may include ferrite nanoparticles including electrically conductive nanoparticles. The electrically conductive nanoparticles may at least partly include metal nanoparticles.

In some implementations, the dielectric material 30 may include multi-layer dielectric sheets with Fabry-Perot characteristics. The dielectric material 30 may provide the effect of a Fabry-Perot interferometer which may be used as a filter for electromagnetic radiation, wherein a narrow-band spectrum may be filtered out from broadband radiation.

In some implementations, the dielectric material 30 may include a radar absorbing material (or radar radiation absorbing material). Radar absorbing material may be a polymer-based material. A radar absorbing material may consist of ferromagnetic or ferroelectric particles embedded in a polymer matrix having a high dielectric constant. A particular radar absorbing material is iron ball paint which may contain tiny metal-coated spheres suspended in an epoxy-based paint. The spheres may be coated with ferrite or carbonyl iron. When electromagnetic radiation enters iron ball paint, it may be absorbed by the ferrite or carbonyl iron molecules which may causes the molecules to oscillate. The molecular oscillations may then decay with the release of heat which may be an effective mechanism of damping electromagnetic waves.

In some implementations, the dielectric material 30 may include at least one of a tuned metamaterial or a tuned electromagnetic bandgap material or electromagnetic bandgap structure. A metamaterial may be a material engineered to have a property that is not necessarily found in naturally occurring materials. A metamaterial may be made of assemblies of multiple elements manufactured from composite materials such as metals and/or plastics and/or dielectrics.

In the following, further possibilities for arranging the dielectric material 30 are described. In some implementations, the dielectric material 30 may be arranged in one or more electromagnetic interference paths as, for example, shown in FIG. 2. In some implementations, the dielectric material 30 may particularly extend in a lateral direction of the semiconductor chip 2 at least between a first high frequency circuit element and a second frequency circuit element. In some implementations, the dielectric material 30 may reduce undesired crosstalk and electromagnetic interferences between different areas of the respective device such that a performance and a reliability of the device may be improved.

Figure 4:
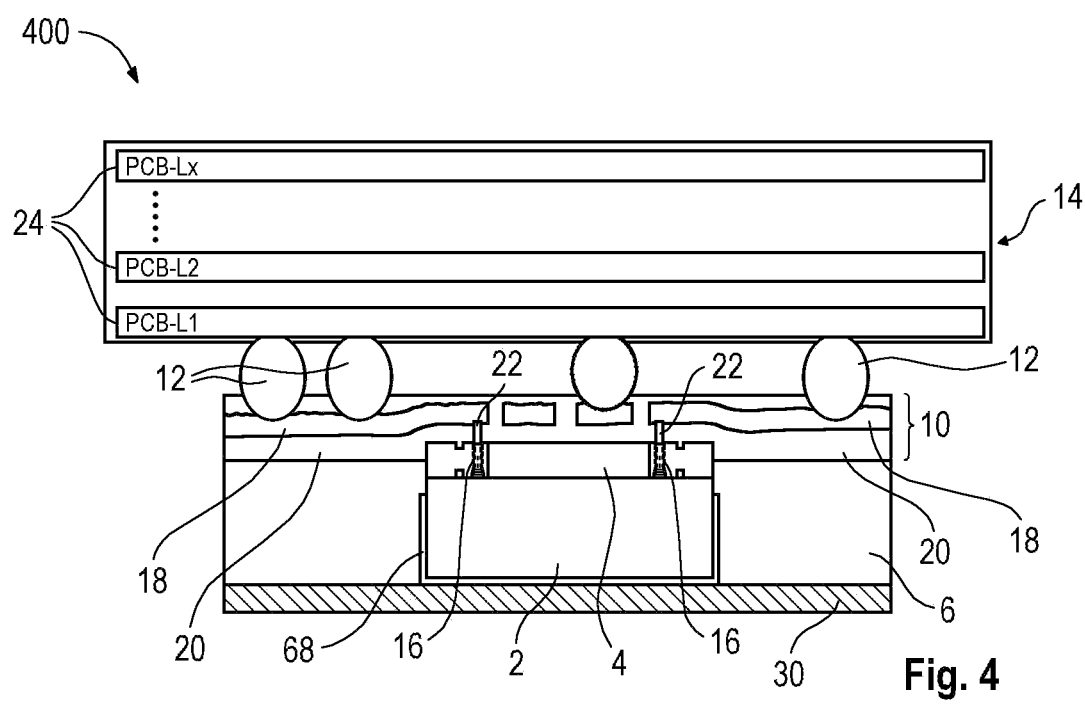
FIG. 4 schematically illustrates a cross-sectional side view of a device, in accordance with the disclosure.

The device 400 of FIG. 4 may include some or all of the features of previously described devices in accordance with the disclosure. In some implementations, the dielectric material 30 of FIG. 4 may at least partly replace the protective layer 8 of FIG. 1. That is, the dielectric material 30 may be arranged on the backside of the semiconductor chip 2, for example in form of a foil, a coating, an electrical bandgap structure and/or a backside protection sheet.

Figure 5:
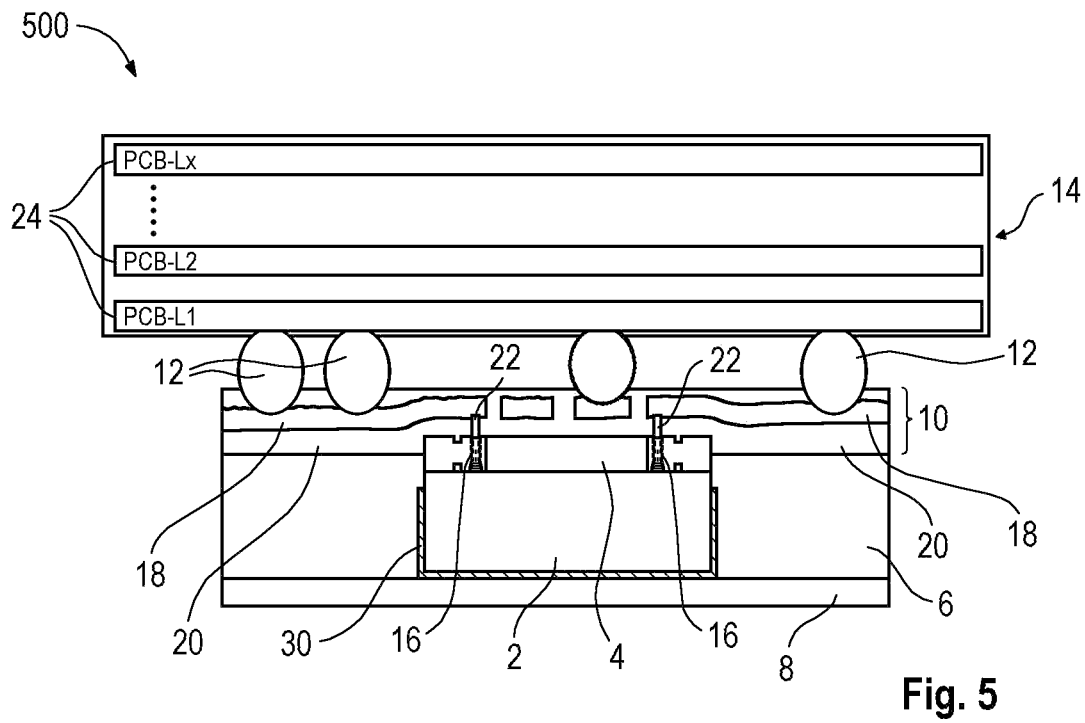
FIG. 5 schematically illustrates a cross-sectional side view of a device, in accordance with the disclosure.

The device 500 of FIG. 5 may include some or all of the features of previously described devices in accordance with the disclosure. In some implementations, the dielectric material 30 may be arranged between the semiconductor chip 2 and the encapsulation material 6. In some implementations, the dielectric material 30 of FIG. 5 may at least partly replace the material layer 68 of FIG. 1. The dielectric material 30 may cover the backside and/or at least one of the side surfaces of the semiconductor chip 2. For example, the dielectric material 30 may be formed as a backside or side surface coating on the semiconductor chip 2 before the semiconductor chip 2 is encapsulated in the encapsulation material 6. In some implementations, the dielectric material 30 may form a silicon die insulation sheet.

Figure 6:
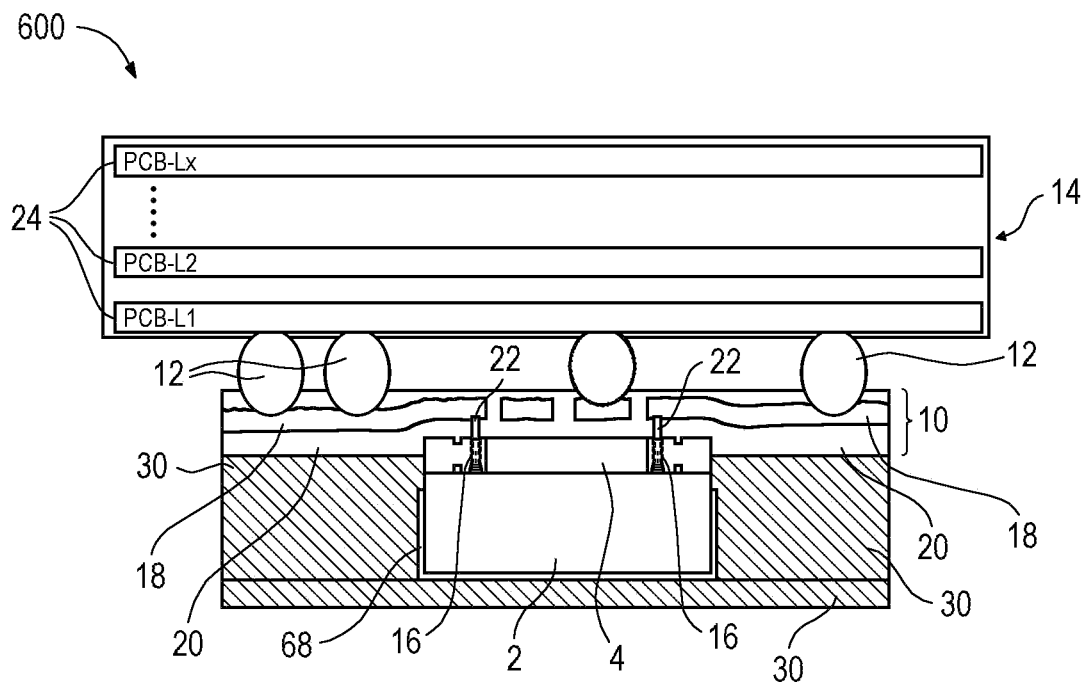
FIG. 6 schematically illustrates a cross-sectional side view of a device, in accordance with the disclosure.

The device 600 of FIG. 6 may include some or all of the features of previously described devices in accordance with the disclosure. The dielectric material 30 of FIG. 6 may be seen as a combination of the dielectric materials 30 of FIGS. 3 and 4. In FIG. 6, the dielectric material 30 may cover the backside and the side surfaces of the semiconductor chip 2. In some implementations, the dielectric material 30 of FIG. 6 may at least partly replace the encapsulation material 6 and the protective layer 8 of FIG. 1. The dielectric material 30 may be formed as one piece or may consist of multiple parts mechanically connected to each other.

Figure 7:
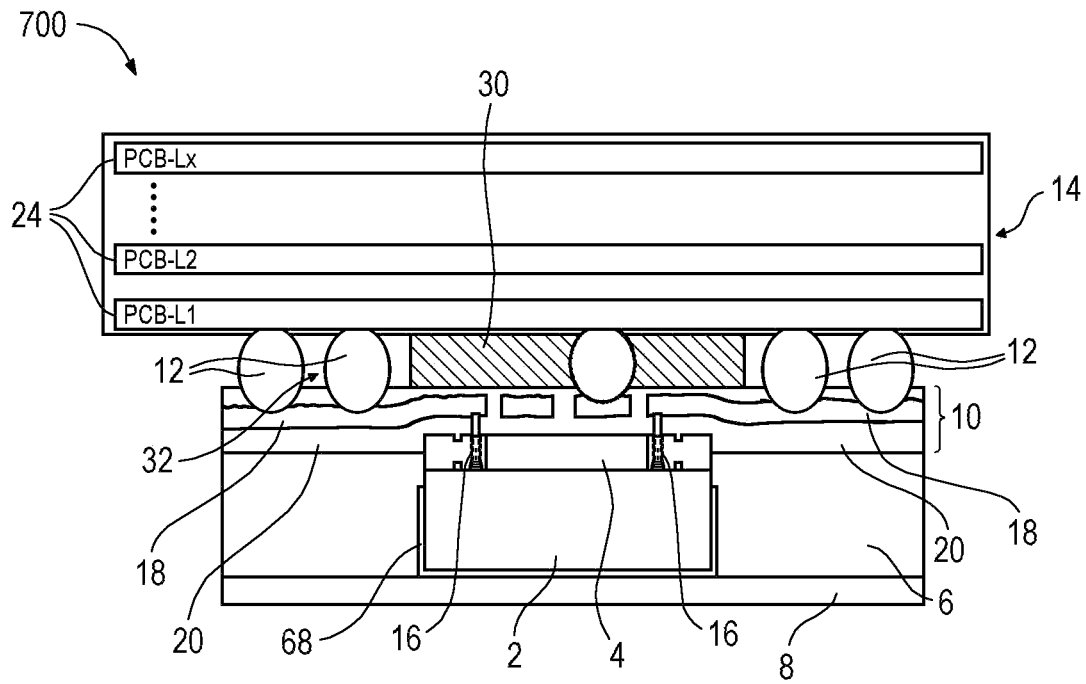
FIG. 7 schematically illustrates a cross-sectional side view of a device, in accordance with the disclosure.

The device 700 of FIG. 7 may include some or all of the features of previously described devices in accordance with the disclosure. The device 700 may be electrically and mechanically coupled to the printed circuit board 14 via the external connection elements 12. A gap 32 may be formed between the upper main surface of the device 700 and the lower main surface of the printed circuit board 14. When measured in the vertical direction, the gap 32 may have a width in a range from about 50 micrometers to about 500 micrometers, or from about 150 micrometers to about 500 micrometers, or from about 250 micrometers to about 500 micrometers, or from about 350 micrometers to about 500 micrometers. The gap 32 may be at least partly be filled with air. The dielectric material 30 may be arranged in the gap 32 between the device 700 and the printed circuit board 14. In some implementations, the dielectric material 30 may only partly fill the gap 32. In some implementations, the dielectric material 30 may fill more than about 20 percent, or more than about 40 percent, or more than about 60 percent, or more than about 80 percent of the gap 32. In some implementations, the gap 32 may be entirely filled with the dielectric material 30.

Figure 8:
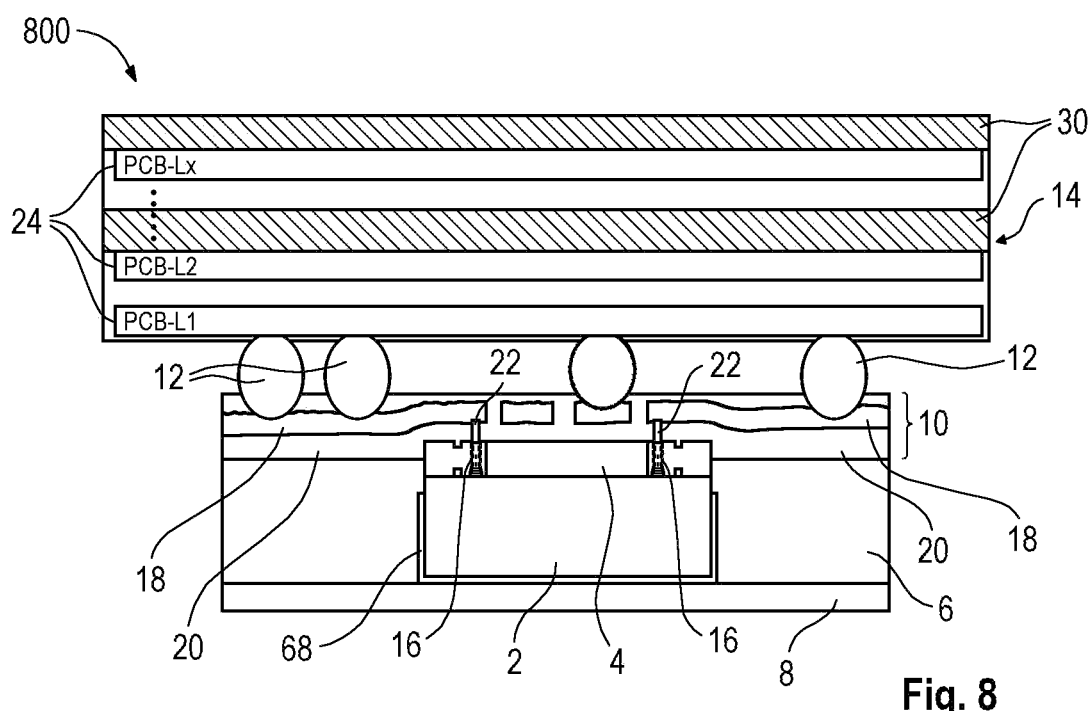
FIG. 8 schematically illustrates a cross-sectional side view of a device, in accordance with the disclosure.

The device 800 of FIG. 8 may include some or all of the features of previously described devices in accordance with the disclosure. In some implementations, the dielectric material 30 may be arranged inside of the printed circuit board 14. In some implementations, the dielectric material 30 may be included in or may replace one or more of the PCB layers 24 described in connection with FIG. 1. With regard to FIG. 8, it is to be noted that the boundary conditions for an unwanted formation of parasitic waveguides by conventional dielectric materials in the printed circuit board 14 may be already met at lower signal frequencies. Using the dielectric material 30 in the printed circuit board 14 as shown in FIG. 8, may thus reduce crosstalk at such lower frequencies.

Figure 9:
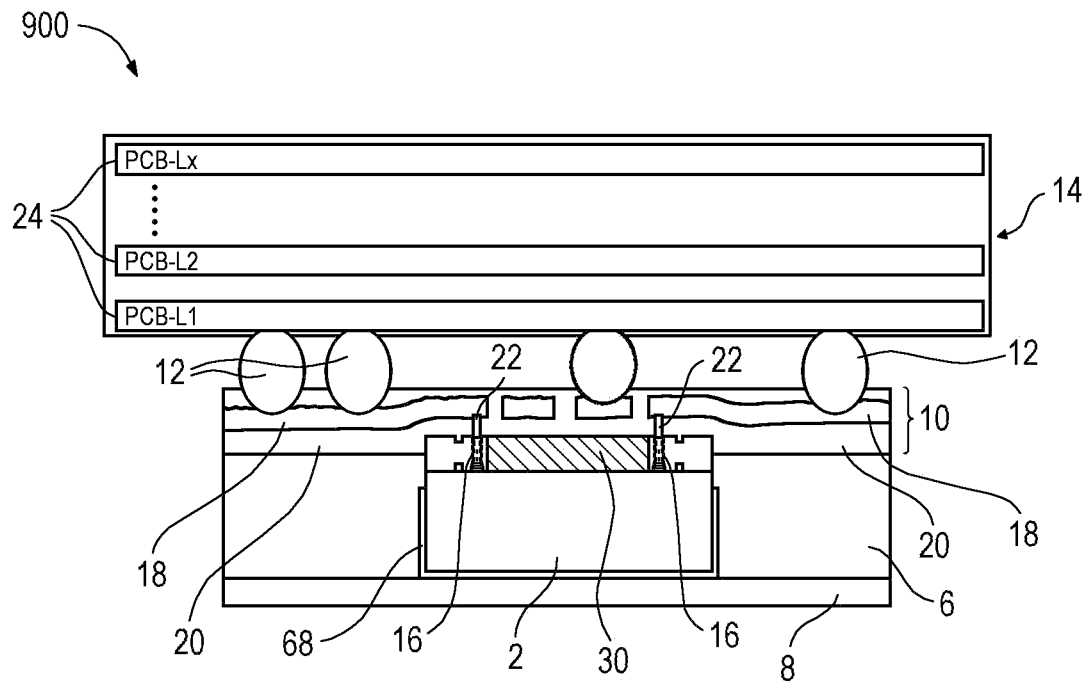
FIG. 9 schematically illustrates a cross-sectional side view of a device, in accordance with the disclosure.

The device 900 of FIG. 9 may include some or all of the features of previously described devices in accordance with the disclosure. In some implementations, the dielectric material 30 may be arranged in the BEOL stack 4 of the semiconductor chip 2. In some implementations, the dielectric material 30 may replace one or more of the dielectric layers of the BEOL stack 4 described in connection with FIG. 1. With regard to FIG. 9, it is to be noted that the boundary conditions for an unwanted formation of parasitic waveguides by conventional dielectric materials in the BEOL stack 4 may be already met at comparatively high frequencies about several 10 GHz frequencies. Using the dielectric material 30 in the BEOL stack 4 as shown in FIG. 9, may thus reduce crosstalk at such high frequencies.

Figure 10:
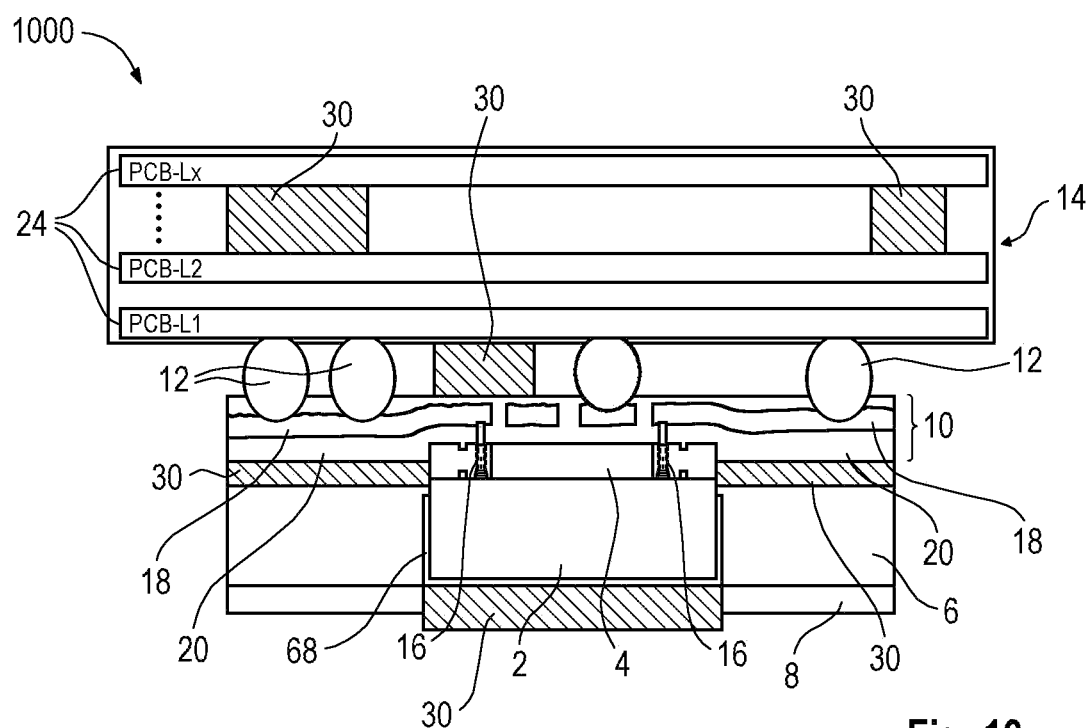
FIG. 10 schematically illustrates a cross-sectional side view of a device, in accordance with the disclosure.

The device 1000 of FIG. 10 may include some or all of the features of previously described devices in accordance with the disclosure. In previously described figures, the dielectric material 30 may have been placed at different position of the respective device. It is understood that in further examples these positions of the dielectric materials 30 may be combined in an arbitrary manner. In the example illustration of FIG. 10, the dielectric material 30 may be arranged in the printed circuit board 14, in the gap 32 between the device 1000 and the printed circuit board 14, in the encapsulation material 6, and over the backside of the semiconductor chip 2. The dielectric materials 30 of FIG. 10 may not necessarily replace entire conventional dielectric layers of the device 1000. For example, cutouts may be formed (e.g., by laser cutting) in conventional dielectric layers of the device 1000, and the cutouts may be filled with the dielectric material 30.

Figure 11:
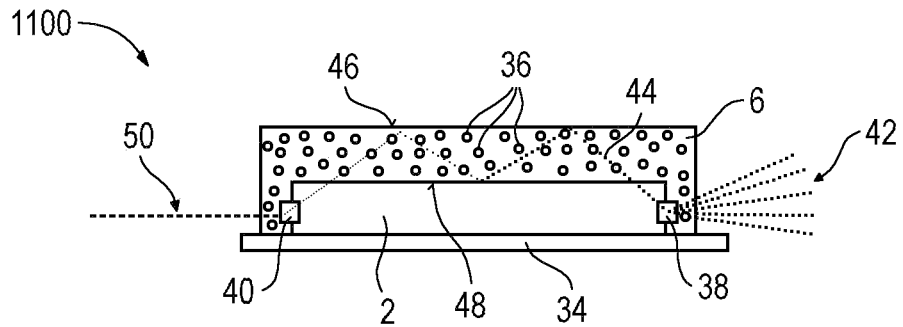
FIG. 11 schematically illustrates a cross-sectional side view of a device, in accordance with the disclosure.

FIG. 11 illustrates a further implementation for attenuating electromagnetic interference signals that may occur in a device 1100. The device 1100 may include a semiconductor chip 2 which may be arranged on a carrier 34. The semiconductor chip 2 may be at least partly encapsulated in an encapsulation material 6 including filler particles 36. In some implementations, the encapsulation material 6 may include or may be made of a mold compound. The semiconductor chip 2 may include one or more transmit antennas 38 as well as one or more receive antennas 40. The device 1100 may include some or all of the features of previously described devices in accordance with the disclosure.

In some implementations, the transmit antenna 38 may be configured to transmit electromagnetic signals 42 in a high frequency range between about 1 GHz and about 1 THz. In some implementations, the transmit antenna 38 may be configured to transmit electromagnetic signals 42 in a high frequency range between about 10 GHz and about 300 GHz. The transmit signals 42 may generate one or more electromagnetic interference signals 44 in the same frequency range which may, inter alia, pass through the encapsulation material 6. When passing through the encapsulation material 6, the interference signals 44 may be at least partly reflected at the upper surface 46 of the encapsulation material 6 and at an interface 48 between the encapsulation material 6 and the semiconductor chip 2. In some implementations, the upper surface 46 may include an interface between the encapsulation material 6 and air. At each reflection, the interference signals 44 may be attenuated. However, at least a part of the transmit signal intensity may reach the receive antenna 40. The receive antenna 40 may be configured to receive electromagnetic signals 50 to be detected. A detection of the receive signals 50 may be disturbed by the interference signals 44. Thus, the transmit antenna 38 may represent a first area of the device 1100 acting as an aggressor and the receive antenna 40 may represent a second area of the device 1100 acting as a victim.

When the interference signal 44 passes through the encapsulation material 6, the interference signal may be attenuated. In some implementations, the filler particles 36 may be configured to scatter the electromagnetic interference signal 44 passing through the encapsulation material 6, thereby reducing the intensity of the signal. The encapsulation material 6 including the filler particles 36 may thus be similar to the dielectric material 30 described in connection with foregoing figures. In a similar fashion, an attenuation of the encapsulation material 6 including the filler particles 36 may be more than 5 dB/cm at least in a subrange of the frequency range between about 1 GHz and about 1 THz (in some implementations between about 10 GHz and about 300 GHz).

Encapsulation materials as described herein may include at least one of the following materials: epoxy, filled epoxy, glass fiber filled epoxy, imide, thermoplast, thermoset polymer, polymer blend. In some implementations, an encapsulation material may be formed from a mold compound. The filler particles 36 may be made of any material configured to scatter electromagnetic radiation in the frequency range between about 1 GHz and about 1 THz (more particular between about 10 GHz and about 300 GHz). For example, the filler particles 36 may include at least one of a metal or a metal alloy. In some implementations, the filler particles 36 may at least partly include nanoparticles. The shape of the filler particles 36 may include at least one of spherical, flake-like, cubical, pyramidal, etc. A concentration of the filler particles 36 in the encapsulation material 6 may be chosen such that a sufficient attenuation of the interference signal may be obtained. Alternatively or additionally to a scattering of the interference signal 44 by the filler particles 36, the encapsulation material 6 may include a mold compound having a graining configured to provide an increased number of reflections when the interference signal 44 passes through the mold compound.

Figure 12A:
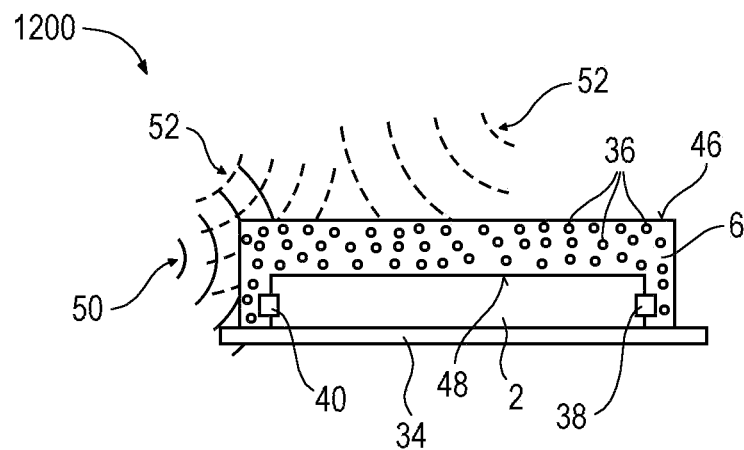
FIGS. 12A and 12B schematically illustrate a cross-sectional side view and a top view of a device, in accordance with the disclosure.
Figure 12B:
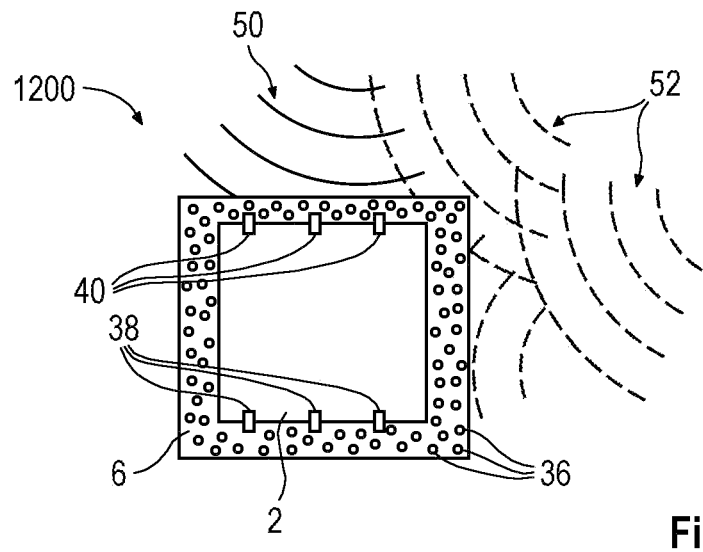

The device 1200 of FIGS. 12A and 12B may include some or all of the features of the device 1100 of FIG. 11. FIG. 12 shows an attenuation of different signals provided by the filler particles 36 in the encapsulation material 6. The receive antenna 40 may be configured to receive a receive signal 50 (indicated by solid wave fronts). In some implementations, the receive antenna 40 may also receive undesired interference signals 52 (indicated by dashed wave fronts) which may result in a decreased signal-to-noise ratio. For example, the interference signals 52 may be received from one or more aggressors (not illustrated). As can be seen from FIG. 12, the interference signals 52 may be scattered and thus attenuated by the filler particles 36. However, the filler particles 36 may also provide an undesired attenuation of the receive signal 50.

Figure 13A:
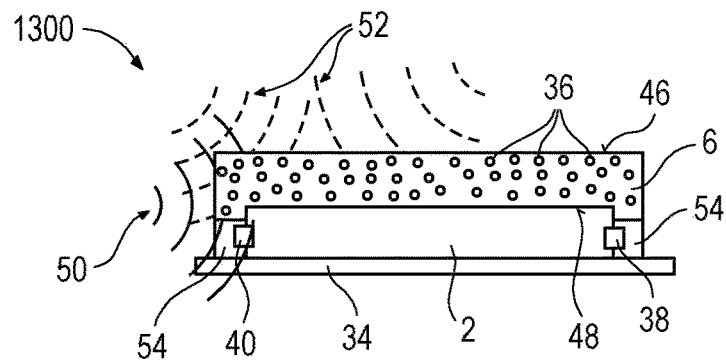
FIGS. 13A and 13B schematically illustrate a cross-sectional side view and a top view of a device, in accordance with the disclosure.
Figure 13B:
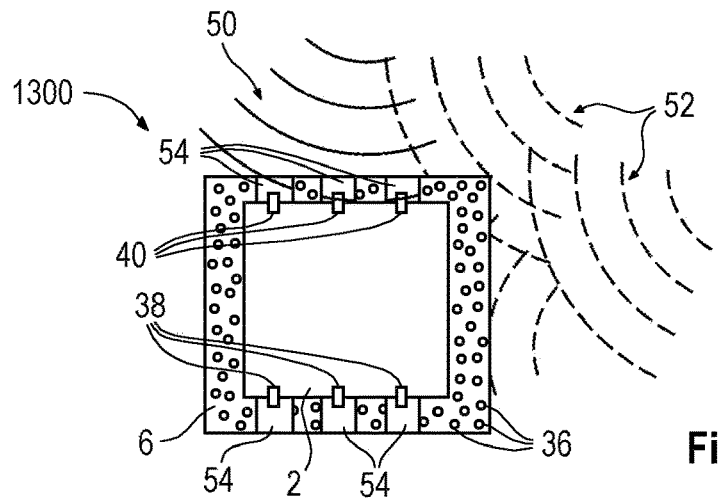

The device 1300 of FIGS. 13A and 13B may include some or all of the features of the device 1200 of FIG. 12. In some implementations, the device 1300 may include a material 54 covering the receive antenna 40. An attenuation of the material 54 may be smaller than an attenuation of the encapsulation material 6 including the filler particles 36. The receive signal 50 may thus be received by the receive antenna 40 without being attenuated by the filler particles 36. At the same time, the interference signals 52 may still be attenuated by the filler particles 36 such that a good signal-to-noise ratio may be obtained. Alternatively or additionally, the material 54 may cover the transmit antenna 38 such that signals radiated by the transmit antenna 38 may not be attenuated by the filler particles 36. In general, the cover material 54 may include any suitable material having a smaller attenuation than the attenuation of the encapsulation material 6 including the filler particles 36. In some implementations, the material 54 may be similar to the encapsulation material 6 without including the filler particles 36. For example, the materials 6 and 54 may be made of or may include a similar mold compound.

Figure 14:
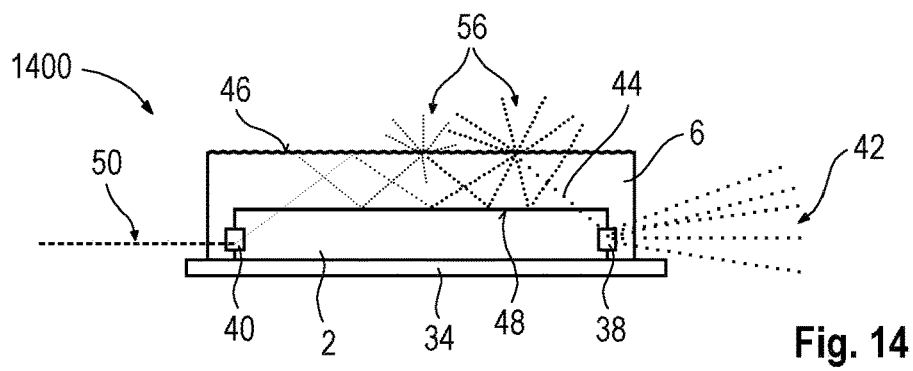
FIG. 14 schematically illustrates a cross-sectional side view of a device, in accordance with the disclosure.

The device 1400 of FIG. 14 may include some or all of the features of the device 1100 of FIG. 11. In some implementations, the encapsulation material 6 may not include filler particles. In some implementations, the upper peripheral surface 46 of the encapsulation material 6 may be rougher compared to the similar surface 46 of FIG. 11. As previously described in connection with FIG. 11, the interference signal 44 may be reflected by the upper surface 46 in FIG. 11. In some implementations, the rougher upper surface 46 of FIG. 14 may cause a scattering of the interference signal 44 instead of a reflection, wherein scattered signals 56 may be generated. The scattering may attenuate the interference signal 44 on its way to the receiver antenna 40 such that a detection of the receive signals 50 may remain substantially undisturbed. In some implementations, the surface roughness of the peripheral surface 46 of the encapsulation material 6 may provide an attenuation of the electromagnetic interference signal 44 between the transmit antenna 38 and the receive antenna 40 of more than 5 dB/cm.

Figure 15:
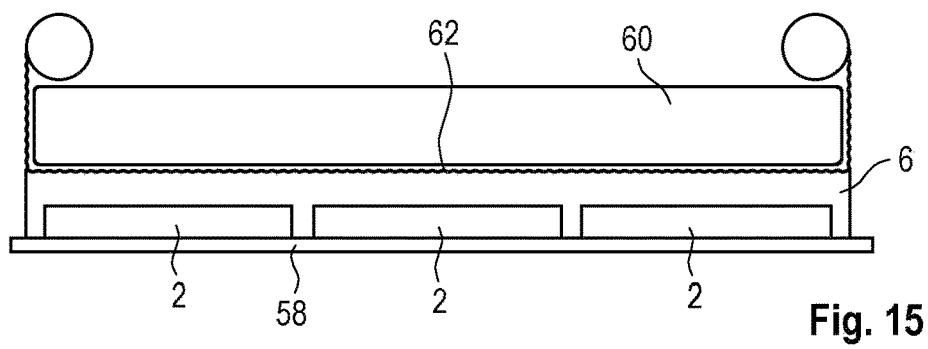
FIG. 15 schematically illustrates a cross-sectional side view of a method for manufacturing a device, in accordance with the disclosure.

FIG. 15 schematically illustrates a method for manufacturing a device in accordance with the disclosure. For example, the method may be used to fabricate one or multiple devices similar to the device 1400 of FIG. 14. In FIG. 15, one or multiple semiconductor chips 2 may be arranged on a substrate 58, and a molding tool 60 may be provided. A foil 62 having a rough surface may be placed on the upper inner surface of the molding tool 60. In some implementations, the substrate 58 and the semiconductor chips 2 may be arranged at a bottom surface (not illustrated) of the molding tool 60. An encapsulation material 6, such as, for example, a molding compound, may be arranged into the cavity of the molding tool 60 and may encapsulate the semiconductor chips 2. During such molding act, the encapsulation material 6 may be pressed against the rough surface of the foil 62. After a hardening of the encapsulation material 6, the molded arrangement may be released from the molding tool 60, wherein the upper surface of the encapsulation material 6 may have a roughness similar to the roughness of the foil 62 against which it was pressed during the molding act.

Figure 16:
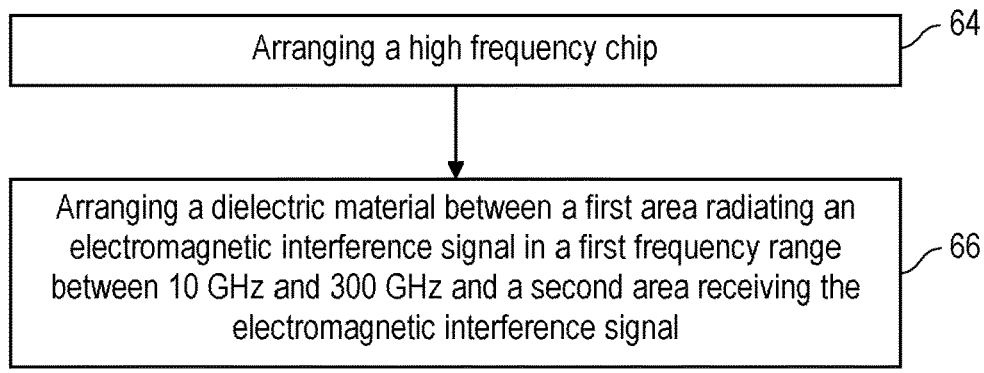
FIG. 16 illustrates a flowchart of a method for manufacturing a device, in accordance with the disclosure.

FIG. 16 illustrates a flowchart of a method for manufacturing a device in accordance with the disclosure. The method is described in a general manner in order to qualitatively specify aspects of the disclosure. It is understood that the method of FIG. 16 may include further aspects. For example, the method of FIG. 16 may be extended by any of the aspects described in connection with other examples in accordance with the disclosure. The method of FIG. 16 may be used for manufacturing a device in accordance with the disclosure. Accordingly, the method may be read in connection with devices in accordance with the disclosure as previously described.

At 64, a high frequency chip may be arranged. At 66, a dielectric material may be arranged between a first area radiating an electromagnetic interference signal in a first frequency range between about 1 GHz and about 1 THz (more particular between about 10 GHz and about 300 GHz) and a second area receiving the electromagnetic interference signal. An attenuation of the dielectric material may be more than 5 dB/cm at least in a subrange of the first frequency range.

ASPECTS

In the following, devices in accordance with the disclosure will be explained using aspects.

Aspect 1 is a device, comprising: a high frequency chip; and a dielectric material arranged between a first area radiating an electromagnetic interference signal in a first frequency range between 1 GHz and 1 THz and a second area receiving the electromagnetic interference signal, wherein an attenuation of the dielectric material is more than 5 dB/cm at least in a subrange of the first frequency range.

Aspect 2 is a device according to Aspect 1, wherein the dielectric material is configured to provide at least one of scattering or absorbing the electromagnetic interference signal.

Aspect 3 is a device according to Aspect 1 or 2, wherein the dielectric material has in a second frequency range an attenuation of at least 5 dB/cm less than in the first frequency range.

Aspect 4 is a device according to Aspect 1 or 2, wherein the dielectric material has in a second frequency range an attenuation of at least 5 dB/cm less than in the first frequency range and in a third frequency range at least 5 dB/cm less than in the first frequency range.

Aspect 5 is a device according to one of the preceding Aspects, wherein an attenuation of the dielectric material is smaller than 0.5 dB/cm for frequencies lower than 1 GHz.

Aspect 6 is a device according to one of the preceding Aspects, wherein the first area comprises at least one of: an electric signal routing path, a power or ground supply distribution path, a section of an integrated circuit, an electrical interconnection element, an antenna.

Aspect 7 is a device according to one of the preceding Aspects, wherein the dielectric material comprises at least one of carbon nanotubes or porous carbon.

Aspect 8 is a device according to one of the preceding Aspects, wherein the dielectric material comprises ferrite nanoparticles including electrically conductive nanoparticles.

Aspect 9 is a device according to one of the preceding Aspects, wherein the dielectric material comprises multi-layer dielectric sheets with Fabry-Perot characteristics.

Aspect 10 is a device according to one of the preceding Aspects, wherein the dielectric material comprises a radar radiation absorbing material.

Aspect 11 is a device according to one of the preceding Aspects, wherein the dielectric material comprises ferromagnetic or ferroelectric particles embedded in a polymer matrix.

Aspect 12 is a device according to one of the preceding Examples, wherein the dielectric material comprises at least one of a tuned metamaterial or a tuned electromagnetic bandgap material or electromagnetic bandgap structure.

Example 13 is a device according to one of the preceding Aspects, further comprising: an encapsulation material, wherein the high frequency chip is at least partly encapsulated in the encapsulation material.

Aspect 14 is a device according to Aspect 13, wherein the dielectric material is part of the encapsulation material.

Aspect 15 is a device according to Aspect 13 or 14, wherein the dielectric material is arranged between the high frequency chip and the encapsulation material.

Aspect 16 is a device according to one of the preceding Aspects, wherein the dielectric material extends in a lateral direction of the high frequency chip at least between a first high frequency circuit element and a second frequency circuit element.

Aspect 17 is a device according to one of the preceding Aspects, wherein the device is configured to be electrically and mechanically coupled to a printed circuit board, wherein the dielectric material is arranged in a gap between the device and the printed circuit board.

Aspect 18 is a device according to one of the preceding Aspects, further comprising: a printed circuit board, wherein the dielectric material is arranged inside of the printed circuit board.

Aspect 19 is a device according to one of the preceding Aspects, wherein the dielectric material is arranged in a BEOL stack of the high frequency chip.

Aspect 20 is a device, comprising: a high frequency chip; and an encapsulation material, wherein the high frequency chip is at least partly encapsulated in the encapsulation material, wherein the encapsulation material is arranged between a first area radiating an electromagnetic interference signal in a first frequency range between 1 GHz and 1 THz and a second area receiving the electromagnetic interference signal, wherein an attenuation of the encapsulation material is more than 5 dB/cm at least in a subrange of the first frequency range.

Aspect 21 is a device according to Aspect 20, wherein the first area comprises a transmit antenna of the device and the second area comprises a receive antenna of the device.

Aspect 22 is a device according to Aspect 20 or 21, further comprising: a material covering the second area, wherein an attenuation of the material is smaller than the attenuation of the encapsulation material.

Aspect 23 is a device according to one of Aspects 20 to 22, wherein: the encapsulation material comprises a mold compound and filler particles embedded in the mold compound, and the filler particles are configured to scatter the electromagnetic interference signal passing through the encapsulation material.

Aspect 24 is a device according to one of Aspects 20 to 23, wherein the filler particles comprise at least one of a metal or a metal alloy.

Aspect 25 is a device, comprising: a high frequency chip; an encapsulation material, wherein the high frequency chip is at least partly encapsulated in the encapsulation material, wherein the encapsulation material is arranged between a first area radiating an electromagnetic interference signal in a first frequency range between 1 GHz and 1 THz and a second area receiving the electromagnetic interference signal, wherein a surface roughness of a peripheral surface of the encapsulation material provides an attenuation of the electromagnetic interference signal between the first and second area of more than 5 dB/cm.

Aspect 26 is a device according to Aspect 25, wherein the first area comprises a transmit antenna and the second area comprises a receive antenna.

Aspect 27 is a device according to Aspect 25 or 26, wherein the peripheral surface comprises an interface between the encapsulation material and air.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to, for example, a material layer formed or located "over" a surface of an object may be used herein to mean that the material layer may be located (e.g. formed, deposited, etc.) "directly on", e.g. in direct contact with, the implied surface. The word "over" used with regard to, for example, a material layer formed or located "over" a surface may also be used herein to mean that the material layer may be located (e.g., formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "example" is used herein to mean serving as an example, instance, or illustration. Any aspect or design described herein as "example" is not necessarily to be construed as advantageous over other aspects or designs. Rather, use of the word example is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A device, comprising:
a high frequency chip;
a first component configured to radiate an interference signal in a first direction and at a first frequency range between 1 gigahertz (GHz) and 1 terahertz (THz);
a second component configured to receive an electromagnetic signal from a second direction different from the first direction; and
a dielectric material residing on side surfaces of the high frequency chip and arranged between the first component and the second component, wherein the dielectric material comprises filler particles at least partly including nanoparticles configured to scatter the interference signal when the interference signal travels through the dielectric material, and wherein, in a subrange of the first frequency range, the dielectric material has an attenuation of more than 5 decibels per centimeter (dB/cm).

2. The device of claim 1, wherein the nanoparticles are further configured to absorb the interference signal.

3. The device of claim 1, wherein, in a second frequency range, the dielectric material has an attenuation of at least 5 dB/cm less than in the first frequency range.

4. The device of claim 1, wherein, in a second frequency range, the dielectric material has an attenuation of at least 5 dB/cm less than in the first frequency range, and wherein, in a third frequency range, the dielectric material has an attenuation at least 5 dB/cm less than in the first frequency range.

5. The device of claim 1, wherein an attenuation of the dielectric material is less than 0.5 dB/cm for frequencies lower than 1 GHz.

6. The device of claim 1, wherein each of the first component or the second component comprises at least one of an electric signal routing path, a power distribution path, a ground supply distribution path, a section of an integrated circuit, an electrical interconnection element, or an antenna.

7. The device of claim 1, wherein the dielectric material further comprises at least one of carbon nanotubes or porous carbon.

8. The device of claim 1, wherein the nanoparticles comprise ferrite nanoparticles including electrically conductive nanoparticles.

9. The device of claim 1, wherein the dielectric material further comprises multi-layer dielectric sheets with Fabry-Perot characteristics.

10. The device of claim 1, wherein the dielectric material further comprises a radar radiation absorbing material.

11. The device of claim 1, wherein the dielectric material further comprises ferromagnetic particles embedded in a polymer matrix or ferroelectric particles embedded in the polymer matrix.

12. The device of claim 1, wherein the dielectric material further comprises at least one of a tuned metamaterial, a tuned electromagnetic bandgap material, or an electromagnetic bandgap structure.

13. The device of claim 1, further comprising:
an encapsulation material, wherein the high frequency chip is at least partly encapsulated in the encapsulation material.

14. The device of claim 13, wherein the dielectric material is part of the encapsulation material.

15. The device of claim 13, wherein the dielectric material is arranged between the high frequency chip and the encapsulation material.

16. The device of claim 1, wherein the dielectric material extends in a lateral direction of the high frequency chip at least between a first high frequency circuit element and a second frequency circuit element.

17. The device of claim 1, wherein the device is configured to be electrically and mechanically coupled to a printed circuit board, wherein the dielectric material is arranged in a gap between the device and the printed circuit board.

18. The device of claim 1, further comprising:
a printed circuit board, wherein the dielectric material is arranged inside of the printed circuit board.

19. The device of claim 1, wherein the dielectric material is arranged in a Back End of Line (BEOL) stack of the high frequency chip.

20. A device, comprising:
a high frequency chip;
a first area configured to radiate an interference signal in a first direction and at a first frequency range between 1 gigahertz (GHz) and 1 terahertz (THz);
a second area configured to receive an electromagnetic signal from a second direction different from the first direction; and
an encapsulation material residing on a top surface and side surfaces of the high frequency chip,
wherein the encapsulation material comprises filler particles at least partly including nanoparticles configured to scatter the interference signal when the interference signal travels through the encapsulation material,
wherein the encapsulation material is arranged between the first area and the second area, and
wherein an attenuation of the encapsulation material is more than 5 decibels per centimeter (dB/cm) at least in a subrange of the first frequency range.

21. The device of claim 20, wherein the first area comprises a transmit antenna of the device and the second area comprises a receive antenna of the device.

22. The device of claim 20, further comprising: another material covering the second area, wherein an attenuation of the another material is smaller than the attenuation of the encapsulation material.

23. The device of claim 20, wherein the encapsulation material comprises a mold compound, wherein the filler particles are embedded in the mold compound.

24. The device of claim 23, wherein the filler particles comprise at least one of a metal or a metal alloy.

25. A device, comprising:
a high frequency chip;
a first component, on a first side of the high frequency chip, configured to radiate an interference signal in a first direction and at a first frequency range between 1 gigahertz (GHz) and 1 terahertz (THz);
a second component, on a second side of the high frequency chip, configured to receive an electromagnetic signal from a second direction different from the first direction, wherein the second side of the high frequency chip is opposite from the first side of the high frequency chip; and
an encapsulation material, wherein the high frequency chip is at least partly encapsulated in the encapsulation material,
wherein the encapsulation material comprises filler particles at least partly including nanoparticles configured to scatter the interference signal when the interference signal travels through the encapsulation material,
wherein the encapsulation material is arranged between the first component and the second component, and
wherein a surface roughness of a peripheral surface of the encapsulation material provides an attenuation of the interference signal between the first component and the second component of more than 5 decibels per centimeter.

26. The device of claim 25, wherein the first component comprises a transmit antenna and the second component comprises a receive antenna.

27. The device of claim 25, wherein the peripheral surface comprises an interface between the encapsulation material and air.

\* \* \* \* \*